United States Patent [19]
Wen

[11] Patent Number: 6,043,127
[45] Date of Patent: Mar. 28, 2000

[54] METHOD FOR MANUFACTURING MULTIPLE STAGE ROM UNIT

[75] Inventor: Jemmy Wen, Hsinchu, Taiwan

[73] Assignee: United Microelectronics Corp., Taiwan

[21] Appl. No.: 09/050,894

[22] Filed: Mar. 31, 1998

Related U.S. Application Data

[62] Division of application No. 08/839,369, Apr. 18, 1997, Pat. No. 5,955,769.

[30] Foreign Application Priority Data

Nov. 25, 1996 [TW] Taiwan ................................. 85114544

[51] Int. Cl.$^7$ ............................................... H01L 21/8246
[52] U.S. Cl. ............................................. 438/278; 438/290
[58] Field of Search .................................... 438/130, 275, 438/276, 277, 278, 282, 286, 290

[56] References Cited

U.S. PATENT DOCUMENTS

| | | | |
|---|---|---|---|
| 5,091,329 | 2/1992 | Bekkering et al. | 438/130 |
| 5,278,078 | 1/1994 | Kanebako et al. | 438/278 |
| 5,378,647 | 1/1995 | Hong | 438/275 |
| 5,668,029 | 9/1997 | Huang et al. | 438/278 |

*Primary Examiner*—Chandra Chaudhari
*Attorney, Agent, or Firm*—Rabin&Champagne P.C.

[57] ABSTRACT

A method of manufacture for a multiple stage ROM unit capable of coding the multiple stages with a single coding implantation and a method of manufacturing the same.

The ROM includes a semiconductor substrate covered by an insulating layer. A gate structure is provided above the insulating layer. A channel region is located on the substrate beneath the gate structure. Source/drain regions are disposed on the semiconductor substrate on each side of the channel region. A cap partially covers the top of the gate structure so as to divide the channel region therebelow into a first channel region and a second channel region such that multiple-level threshold voltages may be coded in the ROM.

12 Claims, 9 Drawing Sheets

6,043,127

METHOD FOR MANUFACTURING MULTIPLE STAGE ROM UNIT

This is a divisional of application Ser. No. 08/839,369, now U.S. Pat. No. 5,955,769, filed Apr. 18, 1997.

BACKGROUND OF THE INVENTION

1. Field of Invention

This invention relates in general to a method for manufacturing an integrated circuit component, and more particularly to a method of manufacture and structure for a masked ROM unit.

2. Description of Related Art

Read only memory (ROM) is general formed from a plurality of memory cell units. Each memory cell unit is actually a metallic-oxide-semiconductor field effect transistor (MOSFET). Through suitable adjustment of the threshold voltage of the field effect transistor by an ion implantation operation, the ON/OFF state of the memory unit can be tailored, and as a result, can serve a coding purpose.

Referring to FIGS. 1 through 3, FIG. 1 is a top view of a conventional ROM unit FIG. 2 is a cross-sectional view taken along line A—A in FIG. 1, showing a section in the direction in which conducting carriers travel along the memory cell unit and FIG. 3 is a cross-sectional view taken along line B—B in FIG. 1, where line A—A and line B—B are approximately perpendicular to each other. Each memory cell unit includes a semiconductor substrate 10, for example, an N-type or a P-type silicon substrate, with field oxide layers 12 already formed above acting as isolating barriers between individual components. An active region 100 is formed above the substrate between the field oxide layers. A gate oxide layer 14 is formed between the field oxide layers 12. A gate terminal structure 16 is located on the gate oxide layer 14 in the active region 100. Source/drain terminals 18 are formed on substrate 10 beneath the gate oxide layer located on each side and at a level below the gate terminal structure 16 in the active region. A channel region 20 is located on the substrate 10 between the source and the drain terminals 18.

In general, the production of ROM can be carried on up to the stage shown in FIG. 2 and FIG. 3. Thereafter, production is delayed until a relevant piece of program code is submitted from the customer. Once the program code has arrived, corresponding programming masks can be manufactured, and then subsequent coding implantation is performed which conditions the threshold voltages of the respective channel regions 20 of the transistors into either an ON or an OFF state, representing a "1" or a "0" state in a binary level logic system.

Because of the restrictions imposed by the design rules on ROM production, as well as the lack of any technological breakthroughs in the manufacturing of integrated circuits, the degree of possible further dimensional reduction of a single transistor binary level logic system is quite limited. Therefore, memory transistors capable of being encoded with three or more levels would be beneficial. However, the number of corresponding coding operations necessary for coding the transistors increases according to the number of levels such multiple stage memory units are designed to have, which increases the production period and consequently lowers the competitiveness of the resulting product.

SUMMARY OF THE INVENTION

It is therefore an object of this invention to provide a multiple stage ROM unit and its method of manufacture, whose coding can be accomplished through a single implantation operation.

To achieve the above object, a multiple stage ROM unit is provided whose structure includes a semiconductor substrate having an insulating layer on top, a gate structure above the insulating layer, a channel region on the substrate underneath the gate structure, source/drain regions on the semiconductor substrate, one on each side of the channel region, and a cap partially covering the top of the gate structure and dividing the channel region below into a first channel region and a second channel region.

A method for manufacturing a multiple stage ROM unit is also provided and includes forming an insulating layer on top of a semiconductor substrate, forming a gate structure above the insulating layer, forming source/drain regions, one on each side and at a level below the gate structure on the semiconductor substrate. A channel region is then formed beneath the gate structure and located between the source and the drain terminals. A cap layer is formed above the gate structure for dividing the channel region into a first channel region and a second channel region. A coding mask which is selected from among a set of coding masks formed of photoresist with patterns imprinted thereon is then provided, wherein one of the set covers the first channel region, a second covers the second channel region, a third covers both the first and the second channel regions and a fourth leaves both the first and the second channel regions exposed. Then a coding implantation operation is performed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

First Preferred Embodiment

Figure 1:
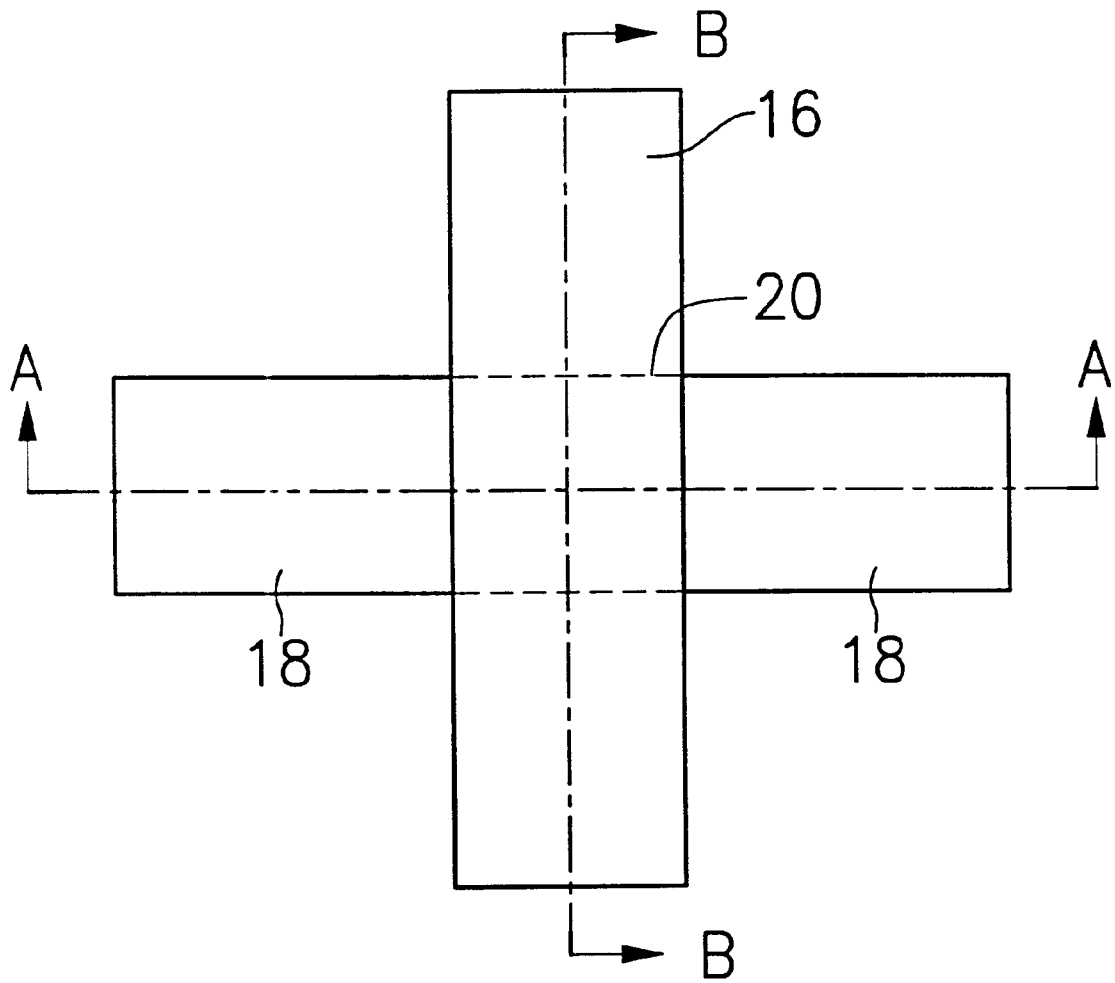
FIG. 1 is a top view showing a conventional ROM unit.
Figure 2:
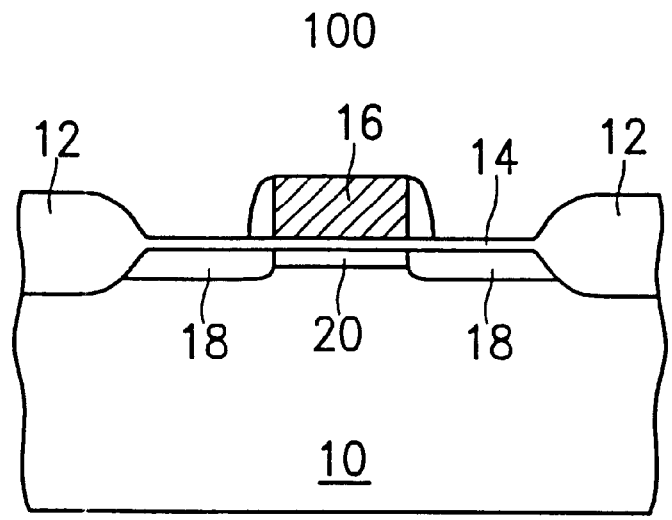
FIG. 2 is a cross-sectional view taken along line A—A of FIG. 1.
Figure 3:
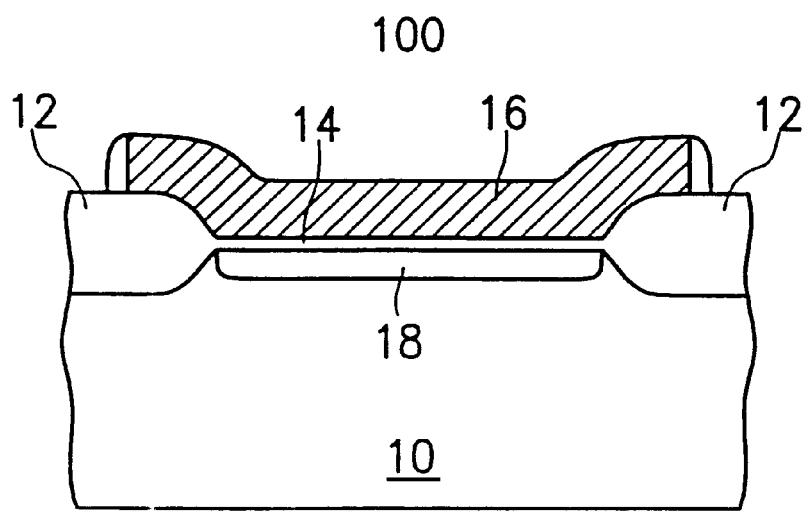
FIG. 3 is a cross-sectional view taken along line B—B of FIG. 1.
Figure 4:
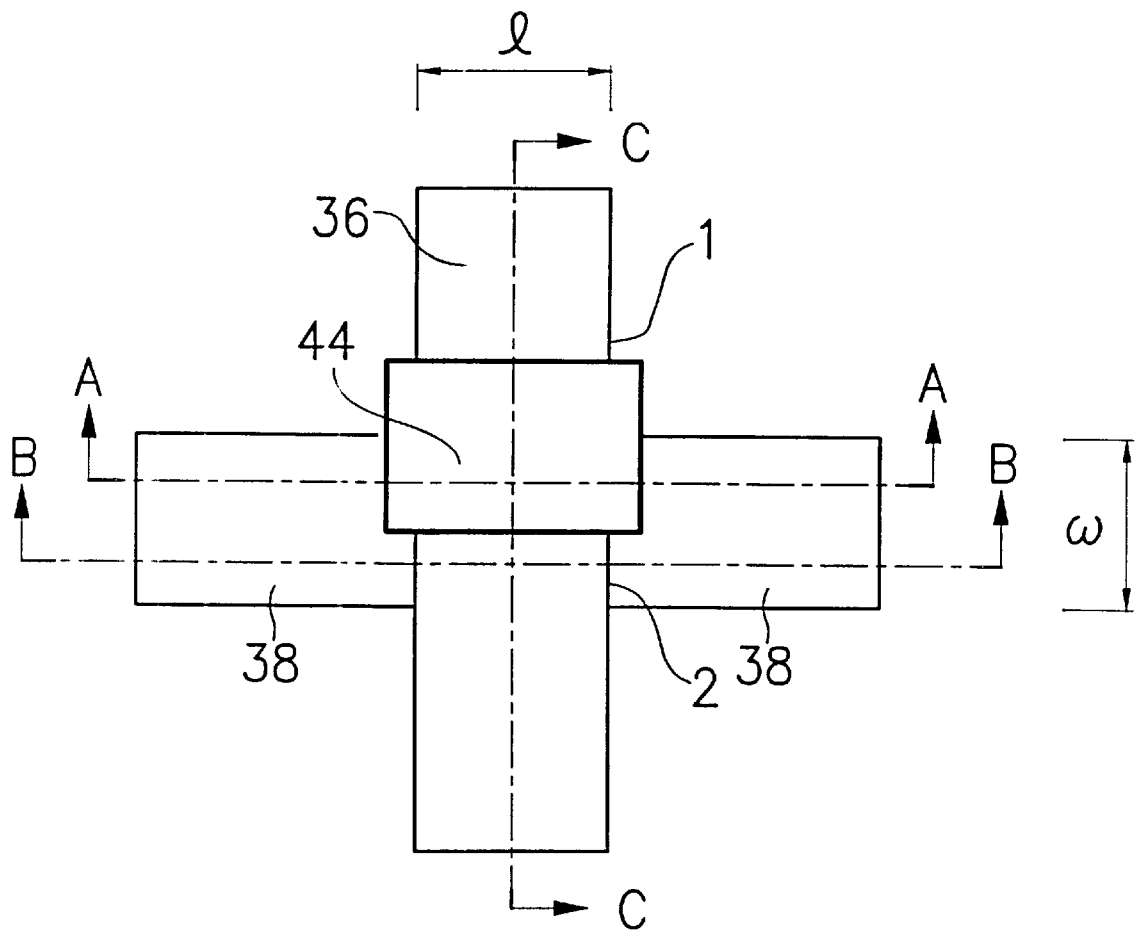
FIG. 4 is a top view showing a ROM unit formed according to a first preferred embodiment of this invention.
Figure 5:
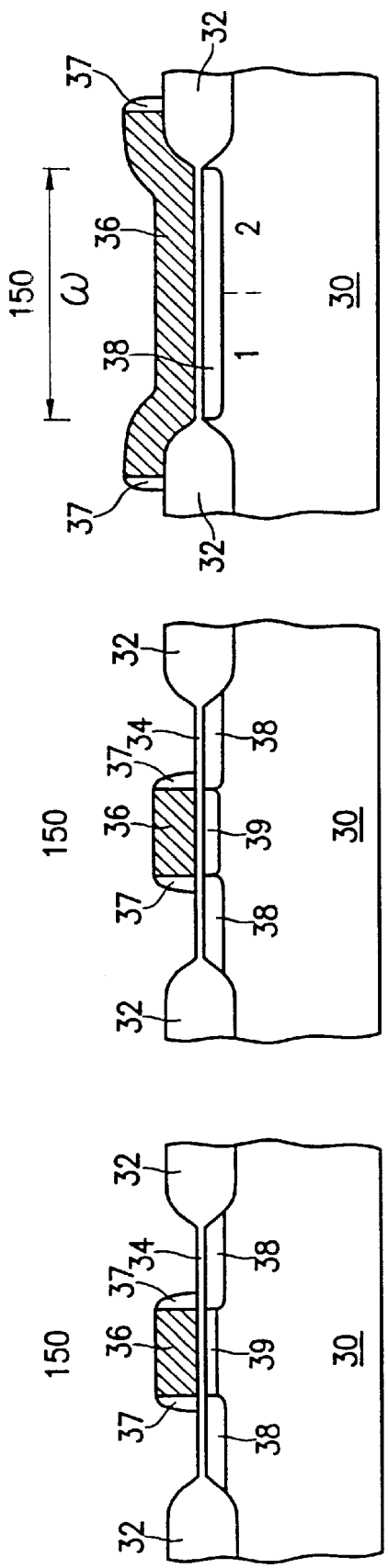
FIGS. 5A through 5C are cross-sectional views showing the manufacturing flow of a method of forming the ROM unit, taken along line A—A of FIG. 4.
Figure 6:
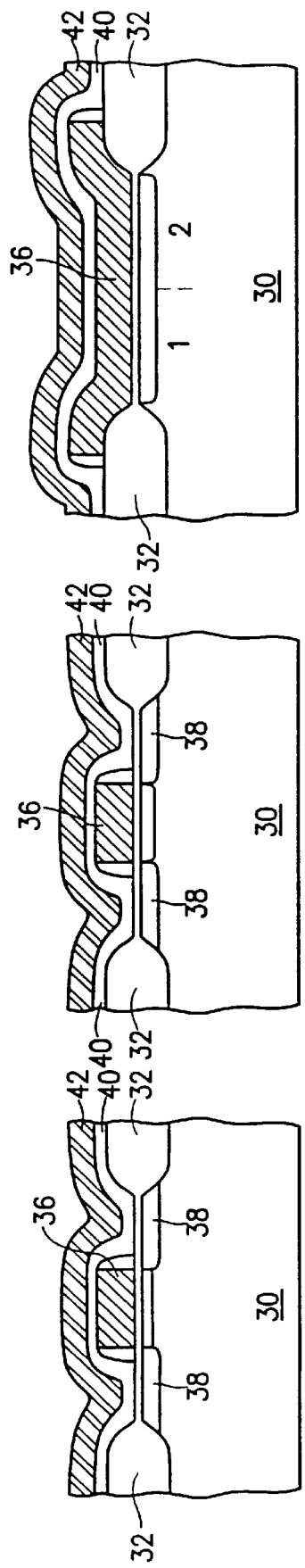
FIGS. 6A through 6C are cross-sectional views showing the manufacturing flow of a method of forming the ROM unit, taken along line B—B of FIG. 4.
Figure 7:
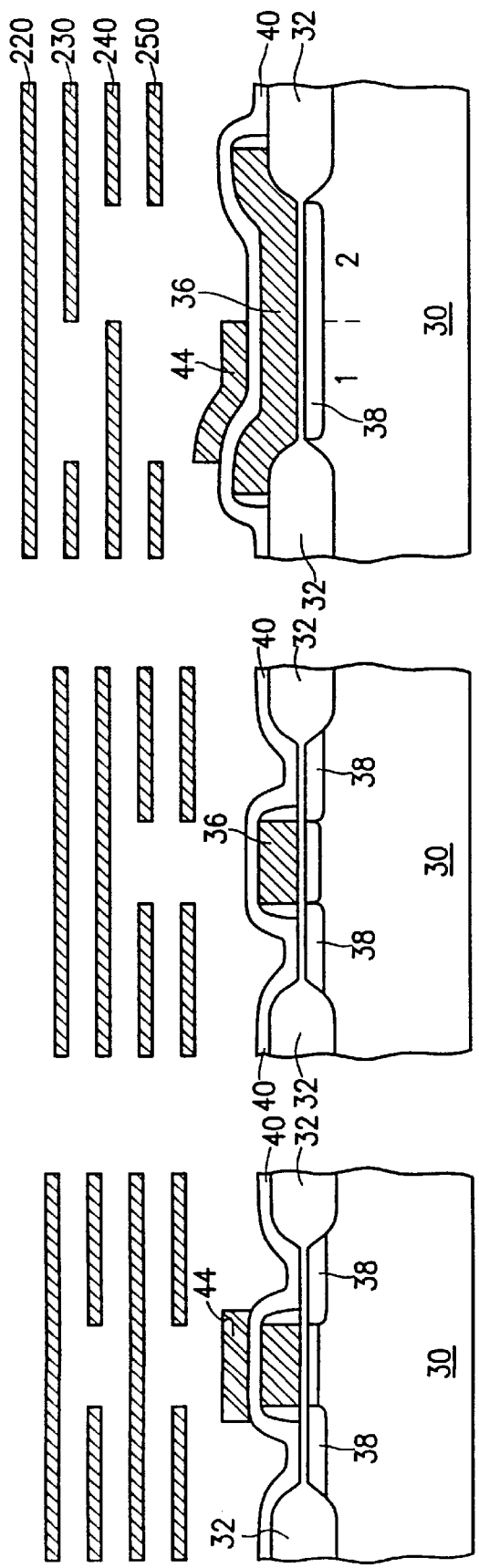
FIGS. 7A through 7C are cross-sectional views showing the manufacturing flow of a method of forming the ROM unit, taken along line C—C of FIG. 4.

Referring to FIGS. 5A, 6A and 7A, which are cross-sectional views taken along lines A—A, B—B and C—C respectively of FIG. 4 showing the first step in the manufacturing of a ROM unit, an insulating layer 32 is formed above a semiconductor substrate 30. For example, a layer of field oxide material is selectively formed above a P-type or an N-type silicon substrate using thermal oxidation, thus defining an active region 150. Next, an insulating layer 34 is formed, for example, by growing a gate oxide layer, and then a gate structure 36 is formed above the semiconductor substrate 30 inside the active region 150, for example, by forming an ion doped polysilicon layer on the insulating layer 34 and then etch-defining the polysilicon layer. Depending on the requirements, sidewall spacers 37 can be grown on each side of the gate structure. Thereafter, source/drain regions 38 are formed on both sides at a level below the gate structure 36 below the insulating layer 34 in the semiconductor substrate 30. If a P-type silicon substrate is used, then N-type ions are implanted for forming an NMOS transistor, while if an N-type silicon substrate is used instead, then P-type ions are implanted for forming a PMOS transistor. Subsequently, an ion implantation process is performed to adjust the ion concentration in the channel regions 39 located beneath the gate structure 36 and between the source/drain terminals 38, so as to condition the threshold voltage $V_{T1}$ to a set value, for example, at about 0.7 V. As will be apparent to those skilled in the art, the adjustment of threshold voltage can also be performed immediately after the formation of the insulating layer 34, and not just after the N or P-type ions are implanted. In a subsequent step, the channel region 39 will be subdivided into a first channel region 1 and a second channel region 2 along the channel in the direction of the width ω of the channel region (i.e. perpendicular to the carrier flow direction) as shown.

FIGS. 5B, 6B and 7B, are respective cross-sectional views along lines A—A, B—B and C—C of FIG. 4, showing the subsequent steps in the manufacturing of a ROM unit A dielectric layer 40 is formed above the aforementioned layers, for example, using chemical vapor deposition to form a layer of oxide, and then a cap layer 42 is formed for example, by depositing a polysilicon layer or a metallic layer.

FIGS. 5C, 6C and 7C are respective cross-sectional views along lines A—A B—B and C—C of FIG. 4 showing further steps in the manufacturing of a ROM unit. The cap layer 42 is selectively etched such that a cap 44 is eventually formed either above the first channel region 1 or the second channel region 2. In this embodiment, the cap is chosen to cover the dielectric layer 40 above the first channel region 1. Generally, this completes the manufacturing operations necessary for forming a memory unit just before coding.

When actual coding is required, depending on the state of storage designed for each memory unit, one of the four coding masks (for example, photoresist layers), namely mask 220, 230, 240 or 250, is selected (referring to FIGS. 5C, 6C and 7C). That is, one of the masks is formed over the substrate so as to cover or expose the first and second channel regions. Coding mask 240 covers up the first channel region 1 while exposing the second channel region 2, coding mask 230 covers up the second channel region 2 while exposing the first channel region 1, coding mask 220 covers up the first and second channels concomitantly, and coding mask 250 exposes both the first and second channels concomitantly. In practice, a layer of photoresist is provided over the many transistors of the ROM and respective patterns are formed in the photoresist each corresponding to a respective one of the selectable coding masks 220, 230, 240, and 250. In a subsequent step, a coding implantation is performed, and due to a specific thickness for the cap 44 material, the second channel region 2 will have a hither ion concentration than the first channel region 1. Since each memory cell unit has its own threshold voltage level, a multiple stage ROM is created. If the type of transistor used in a memory unit is an NMOS transistor, and further, P-type ions (for example, boron ions) are used in the coding implantation, then the threshold voltage will be raised after the coding operation has been completed. However, if N-type ions (for example, phosphorus ions) are used instead, then the threshold voltage will be lowered after the coding operation has been completed. On the other hand, if the type of transistor used in a memory unit is a PMOS transistor, and further, N-type ions are used in the coding implantation, then the threshold voltage will be raised after the coding operation is completed, and similarly if P-type ions are used instead, then the threshold voltage will be lowered after the coding operation is completed.

Table 1 is an example illustrating how various threshold voltages are obtained according to the type of coding mask selected for a P-type silicon substrate with N-type ions implanted into its source/drain regions, and receiving coding implantation with P-type

TABLE 1

| selectable coding mask | the first channel region | the second channel region |
|---|---|---|
| 220 | $V_{T1}$ | $V_{T1}$ |
| 230 | $V_{T2}$ | $V_{T1}$ |
| 240 | $V_{T1}$ | $V_{T3}$ |
| 250 | $V_{T2}$ | $V_{T3}$ | in accordance with the foregoing selection of one of the coding masks 220, 230, 240 and 250 for the coding operation, the threshold voltages of the first and the second channel regions are both at a voltage level $V_{T1}$ before coding, but the threshold voltage of the first channel region 1 is changed from $V_{T1}$ to $V_{T2}$) while the threshold voltage of the second channel region 2 is changed from $V_{T1}$ to $V_{T3}$, and their threshold voltage levels are related by the inequality relation $V_{T3} > V_{T2} > V_{T1}$.

Figure 11:
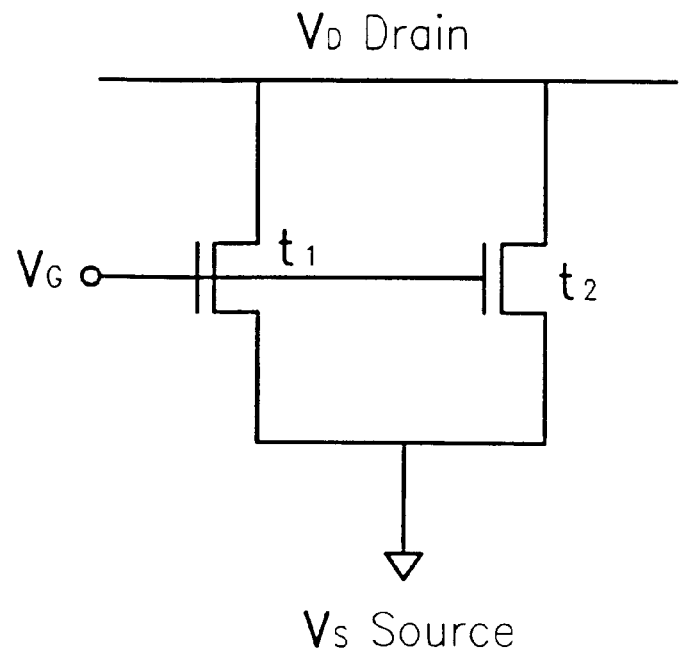
FIG. 11 is an equivalent circuit diagram of the unit of FIG. 4.

Lastly referring to FIG. 11, which is an equivalent circuit diagram for the memory unit shown in FIG. 4, transistors t1 and t2 are connected in parallel with both drains connected to a common drain and both sources connected to a common source.

Second Preferred Embodiment

Figure 8:
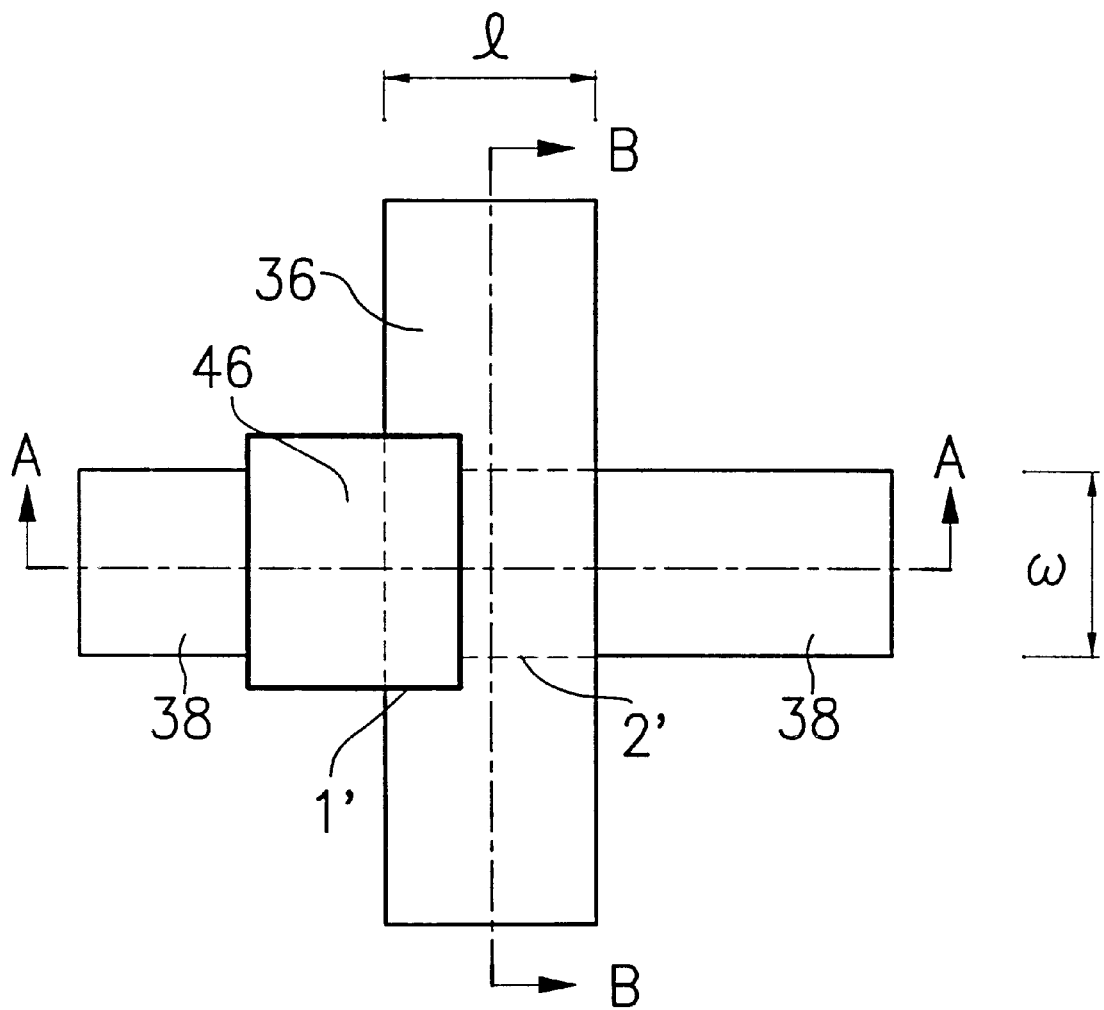
FIG. 8 is a top view showing a ROM unit formed according to a second preferred embodiment of this invention.
Figure 9:
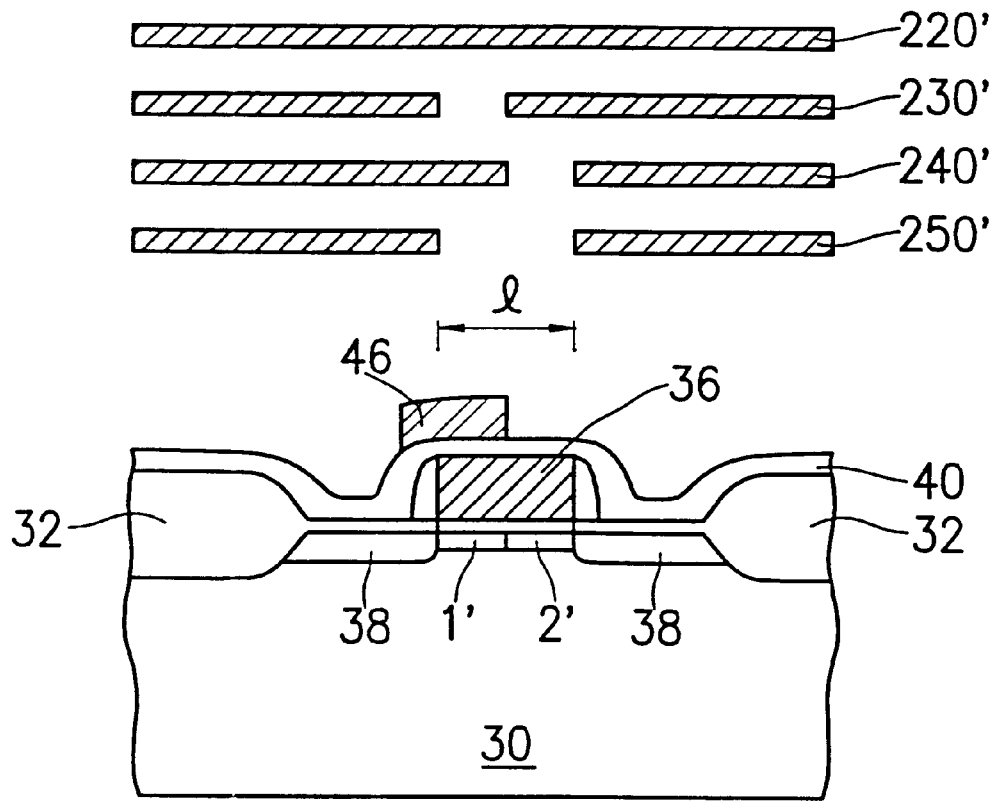
FIG. 9 is a cross-sectional view taken along line A—A of FIG. 8.
Figure 10:
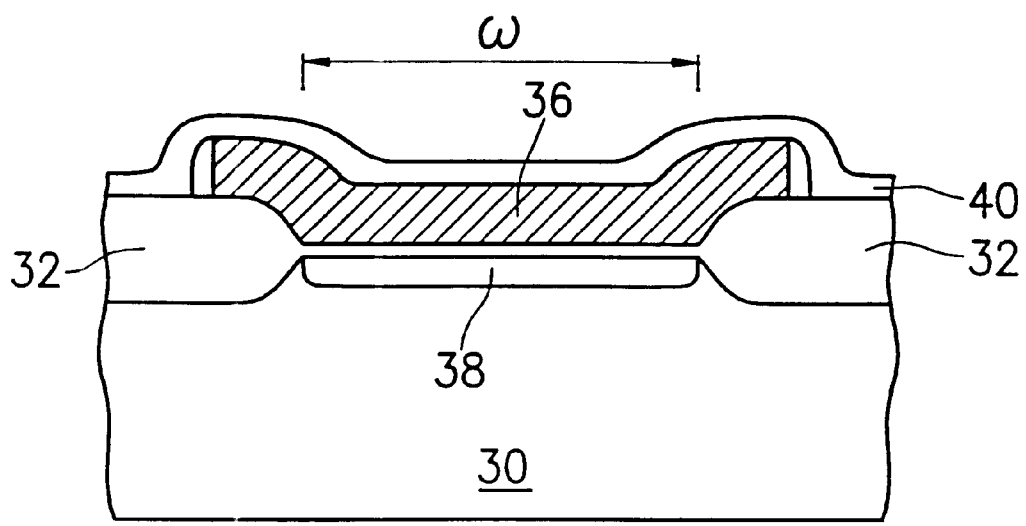
FIG. 10 is a cross-sectional view taken along line B—B of FIG. 8.

Referring to FIG. 8, which is a top view showing a ROM unit formed according to a second preferred embodiment of the invention, and FIGS. 9 and 10 which are the respective cross-sectional views taken along lines A—A and B—B of FIG. 8, the manufacturing process of the second embodiment is very similar to the first preferred embodiment. Components such as the insulating layer 32 defining the active region, the gate structure 36, source/drain terminals 38 and the dielectric layer 40 are similarly formed above a semiconductor substrate 30, and so detailed descriptions are not repeated here. The main difference concerns the way the first channel region 1 and the second channel region 2 are divided. The division in this embodiment is along the length l of the channel region 39 (the direction of carrier flow). Hence, after the formation of a cap layer (not shown in the figure), and similar to the first embodiment, a cap 46 is formed by etching so as to leave either the first channel region 1 or the second channel region 2 still covered. In this embodiment, the first channel region 1 is the one chosen to be covered. This completes the manufacturing process necessary for the construction of a memory unit up to the point of coding.

When actual coding is required, depending on the state of storage designed for each memory unit, one of the four coding masks (equivalent to a photoresist layer), namely, mask 220', 230', 240' or 250', is selectively provided. That is, one of the masks is formed over the substrate so as to cover or expose the first and second channel regions. Coding mask 240' covers up the first channel region 1 while exposing the second channel region 2, coding mask 230' covers up the second channel region 2 while exposing the first channel region 1, coding mask 220' covers up both of the first and the second channels concomitantly, and coding mask 250' exposes both the first and the second channels concomitantly. In the subsequent step, a coding implantation is performed, and due to a specific thickness for the cap 46, the ion concentration within the first channel region 1 and the second channel region 2 will not be the same after the coding implantation. This leads to different levels of change of their threshold voltages, and thus a multiple stage ROM is created (the principles of operation are identical to that obtained with the example for the first embodiment illustrated in Table 1).

Figure 12:
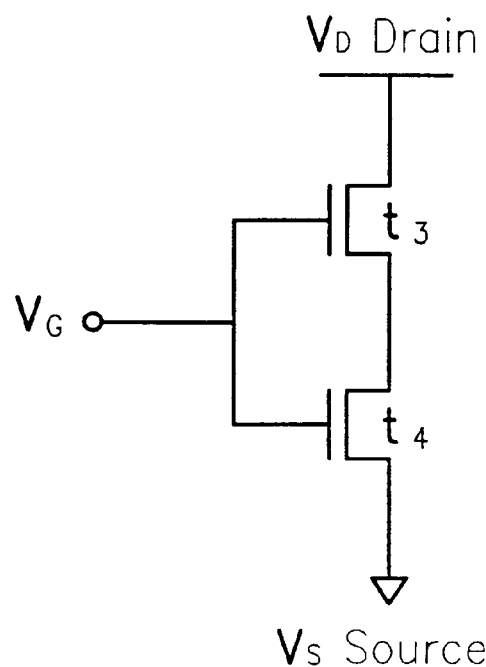
FIG. 12 is an equivalent circuit diagram of the unit of FIG. 8.

Lastly, referring to FIG. 12, which is an equivalent circuit diagram of the memory unit shown in FIG. 8, transistors t3 and t4 are connected in series with the drain terminal of transistor t3 coupled to the common drain and the source terminal of transistor t4 coupled to the common source.

From the above two embodiments, it can be observed that a characteristic of this invention lies in the addition of a cap such as cap 44 or cap 46. Through the use of such caps, a single coding implantation is able to create a multiple stage ROM unit and saves the trouble of having to perform repeated coding operations by conventional methods.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for manufacturing a ROM, comprising:

(a) forming an insulating layer on top of a semiconductor substrate;

(b) forming a gate structure above the insulating layer;

(c) forming source/drain regions on opposite sides of the gate structure and located at a level below the gate structure on the semiconductor substrate;

(d) forming a channel region beneath the gate structure and located between the source and drain terminals;

(e) forming a cap above the gate structure, to divide the channel region into a first channel region and a second channel region;

(f) after formation of the cap, forming a coding mask from among a set of selectable coding masks of photoresist having patterns imprinted therein, the masks including one mask which is selectable to cover the first channel region, a second mask which is selectable to cover the second channel region, a third mask which is selectable to cover both the first channel region and the second channel region and a fourth mask which is selectable to expose both the first channel region and the second channel region; and (g) performing a coding implantation operation.

2. A method of manufacture according to claim 1, wherein the semiconductor substrate is a silicon substrate.

3. A method of manufacture according to claim 1, wherein the insulating layer is a silicon dioxide layer.

4. A method of manufacture according to claim 3, wherein the cap is made from polysilicon material.

5. A method of manufacture according to claim 1, wherein the insulating layer is a silicon nitride layer.

6. A method of manufacture according to claim 5, wherein the cap is made from metallic material.

7. A method of manufacture according to claim 1, wherein the insulating layer is a polysilicon layer.

8. A method of manufacture according to claim 1, wherein the formation of the cap includes formatting a dielectric layer, forming a cap layer over the dielectric layer and etching the cap layer to form the cap.

9. A method of manufacture according to claim 1, wherein the gate structure is made from polysilicon material.

10. A method of manufacture according to claim 1, wherein the source/drain regions are formed by impurities implantation.

11. A method of manufacture according to claim 1, wherein the cap covers the first channel region and exposes the second channel region.

12. A method of manufacture according to claim 1, wherein the formation of the cap includes:

forming a cap layer;

forming a photoresist layer covering predetermined patterns above the cap layer to act as a mask; and etching away part of the cap layer not protected by the photoresist layer, to form the cap.

* * * * *